(12) United States Patent
Stark (10) Patent No.: US 8,904,258 B2
(45) Date of Patent: Dec. 2, 2014

(54) MODULATION-FORWARD ERROR CORRECTION (MFEC) CODES AND METHODS OF CONSTRUCTING AND UTILIZING THE SAME

(75) Inventor: Jason Blain Stark, Holmdel, NJ (US)

(73) Assignee: Zephyr Photonics, Zephyr Cove, NV (US)

( * ) Notice: Subject to any disclaimer, the term of this patent is extended or adjusted under 35 U.S.C. 154(b) by 417 days.

(21) Appl. No.: 12/876,342

(22) Filed: Sep. 7, 2010

(65) Prior Publication Data

US 2012/0060070 A1     Mar. 8, 2012

(51) Int. Cl.
*H03M 7/46*     (2006.01)
*H03M 13/03*    (2006.01)

(52) U.S. Cl.
USPC .............................. 714/752; 341/58; 341/59

(58) Field of Classification Search
USPC ..................................... 714/752; 341/58, 59
See application file for complete search history.

(56) References Cited

U.S. PATENT DOCUMENTS

| | | | | | |
|---|---|---|---|---|---|
| 4,811,361 | A  * | 3/1989  | Bacou et al. | ................ | 375/242 |
| 6,052,248 | A  * | 4/2000  | Reed et al. | .................. | 360/53 |
| 6,631,490 | B2 * | 10/2003 | Shimoda | .................... | 714/755 |
| 6,795,947 | B1 * | 9/2004  | Siegel et al. | .................. | 714/802 |
| 6,989,776 | B2 * | 1/2006  | Tsang | ........................ | 341/59 |
| 7,000,177 | B1 * | 2/2006  | Wu et al. | ..................... | 714/801 |
| 7,030,789 | B1 * | 4/2006  | Cideciyan et al. | ............ | 341/83 |
| 7,071,851 | B1 * | 7/2006  | Blaum et al. | .................. | 341/59 |
| 7,103,830 | B1 * | 9/2006  | Dong | ........................... | 714/784 |
| 7,174,485 | B2 * | 2/2007  | Silvus | .......................... | 714/701 |
| 7,290,184 | B2 * | 10/2007 | Bruner et al. | ................. | 714/704 |
| 7,307,556 | B2 * | 12/2007 | Lee | ................................ | 341/59 |
| 7,409,622 | B1 * | 8/2008  | Lu et al. | ........................ | 714/755 |
| 7,714,748 | B1 * | 5/2010  | Chaichanavong | ............. | 341/58 |
| 7,962,827 | B2 * | 6/2011  | Tang et al. | .................... | 714/755 |
| 8,028,216 | B1 * | 9/2011  | Yeo et al. | ...................... | 714/755 |
| 8,049,648 | B2 * | 11/2011 | Chaichanavong | ............. | 341/58 |
| 8,055,977 | B2 * | 11/2011 | Ito | ................................. | 714/758 |
| 8,069,391 | B1 * | 11/2011 | Wu et al. | ...................... | 714/758 |
| 8,151,162 | B2 * | 4/2012  | Kanaoka et al. | ............. | 714/755 |
| 8,161,347 | B1 * | 4/2012  | Kou | .............................. | 714/755 |
| 8,225,148 | B2 * | 7/2012  | Tang et al. | .................... | 714/701 |

OTHER PUBLICATIONS

Popplewell et al., "Performance Aspects of Error Correcting Line Codes", Second IEE National Conference on Telecommunications, 1989, pp. 47-52.*

* cited by examiner

*Primary Examiner* — Stephen M Baker

(57) ABSTRACT

Embodiments of the present invention generally relate to binary block transmission codes for high-speed network transmissions. More specifically, embodiments of the present invention relate to bounded-disparity run-length-limited forward error correction codes and methods of constructing and utilizing same. In one embodiment, a method for generating binary block bounded-disparity run-length-limited forward error correction transmission codes comprises selecting an existing base code, deriving a sub-code from the existing base code, having properties indicated by disparity bound, run-length limit and minimum distance, ascertaining a plurality of codewords and control characters from within the sub-code, encoding Messages to be transmitted with at least one codeword from the plurality of codewords, transmitting codewords from a transmitter to a receiver, and decoding the codewords into Messages.

20 Claims, 6 Drawing Sheets

MODULATION-FORWARD ERROR CORRECTION (MFEC) CODES AND METHODS OF CONSTRUCTING AND UTILIZING THE SAME

BACKGROUND

1. Field of the Invention

Embodiments of the present invention generally relate to binary block transmission codes for high-speed network transmissions. More specifically, embodiments of the present invention relate to forward error correction codes that are simultaneously bounded-disparity and/or run-length-limited and methods of constructing same.

2. Description of the Related Art

Error correction was once reserved for scenarios where probability of error was high, such as communication between two wireless devices. Now, however, error correction is being applied to scenarios where the probability of error is relatively low, such as communication between two servers, which are communicating through some parallel or serial connection, or any two communication devices on any suitable electrical backplane.

Many known error correction techniques are performed by using correction codes to transform error data into useable, and highly reliable, bytes of information. However, many of these correction codes and methods therewith do not address all, or even a majority, of the common transmission problems generally encountered. Thus, there is a need for bounded-disparity run-length-limited forward error correction codes and methods of constructing and utilizing same in binary block transmission environments.

SUMMARY

Embodiments of the present invention relate to binary block transmission codes for high-speed network transmissions. More specifically, embodiments of the present invention relate to Modulation—Forward Error Correction (MFEC) codes and methods of constructing and utilizing same.

In one embodiment of the present invention, a method for generating binary block MFEC transmission codes comprises selecting an existing base code, deriving a sub-code from the existing base code, having properties indicated by minimum distance, disparity bound and/or run-length limit, ascertaining a plurality of codewords and control characters from within the sub-code, encoding Messages to be transmitted with at least one codeword from the plurality of codewords, transmitting codewords from a transmitter to a receiver, and decoding the codewords into Messages.

In another embodiment of the present invention, a tangible computer readable medium comprises program instructions, wherein the program instructions are computer-executable to implement: selecting an existing base code, deriving a sub-code from the existing base code, having properties indicated by disparity bound, run-length limit and minimum distance, ascertaining a plurality of codewords and control characters from within the sub-code, encoding Messages to be transmitted with at least one codeword from the plurality of codewords, and transmitting codewords from a transmitter to a receiver.

In yet another embodiment of the present invention, a system for utilizing MFEC codes comprises a transmitter for transmitting Messages, a receiver for receiving Messages, an encoder located with the transmitter, the encoder comprising: a tangible computer readable medium comprising program instructions, wherein the program instructions implement: encoding Messages to be transmitted with at least one codeword from the plurality of MFEC codewords, and transmitting codewords from a transmitter to a receiver, and a decoder located with the receiver, the decoder comprising: a tangible computer readable medium comprising program instructions, wherein the program instructions are computer-executable to implement: decoding the codewords into Messages.

BRIEF DESCRIPTION OF THE DRAWINGS

So that the manner in which the above recited features of the present invention can be understood in detail, a more particular description of embodiments of the present invention, briefly summarized above, may be had by reference to embodiments, which are illustrated in the appended drawings. It is to be noted, however, the appended drawings illustrate only typical embodiments of embodiments encompassed within the scope of the present invention, and, therefore, are not to be considered limiting, for the present invention may admit to other equally effective embodiments, wherein.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures.

DETAILED DESCRIPTION

In the following detailed description, numerous specific details are set forth in order to provide a thorough understanding of exemplary embodiments or other examples described herein. However, it will be understood that these examples may be practiced without the specific details. In other instances, well-known methods, procedures, and components have not been described in detail, so as to not obscure the following description. Furthermore, the examples disclosed herein are for exemplary purposes only and other examples may be employed in lieu of, or in combination with, the examples disclosed.

Embodiments of the present invention relate to binary block transmission codes for high-speed transmission systems. More specifically, embodiments of the present invention relate to Modulation—Forward Error Correction (MFEC) codes and methods of constructing and utilizing same.

Figure 1:
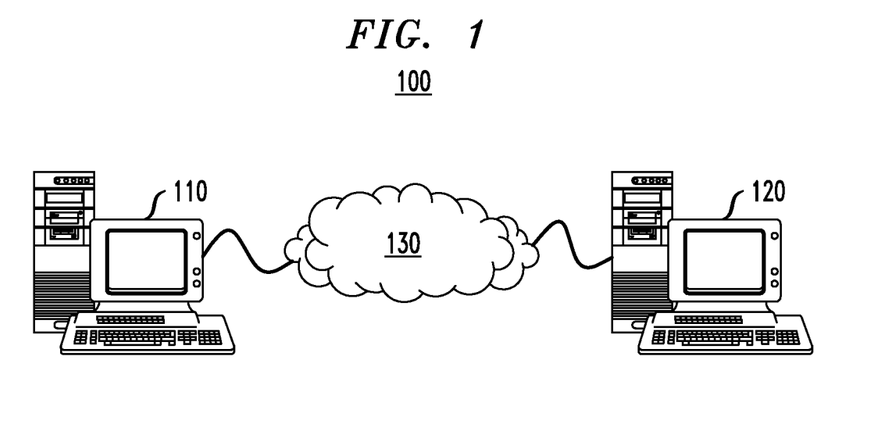
FIG. 1 depicts an exemplary system in accordance with one embodiment of the present invention.

FIG. 1 depicts an exemplary system in accordance with one embodiment of the present invention. A basic system 100 comprises at least a transmitter 110, a receiver 120, and a transmission system 130 over which to transmit data. In a very elementary overview, the system 100 is generally capable of encoding a Message, associating the encoded Message with a codeword, and using the transmitter 110 to transmit the data through the transmission system 130 to the receiver 120. At the receiver 120, the received data may be decoded and the Message may be understood.

The transmission system 130 may be a partial or full deployment of most any communication or computer network, link or channel, including any of, any multiple of, any combination of, or any combination of multiples of, an electronic circuit trace, transmission system electronic or optical physical medium, public or private, terrestrial wireless or satellite system, and wireline networks or links.

The transmission system 130 may include, for example, network elements from a Public Switch Telephone Network (PSTN), the Internet, core and proprietary public networks, wireless voice and packet-data networks, such as 1G, 2G, 2.5G and 3G telecommunication networks, wireless office telephone systems (WOTS) and/or wireless local area networks (WLANs), including, Bluetooth and/or IEEE 802.11 WLANs, wireless personal area networks (WPANs), wireless metropolitan area networks (WMANs) and the like; and/or communication links, such as Universal Serial Bus ("USB") links; parallel port links, Firewire links, RS-232 links, RS-485 links, Controller-Area Network ("CAN") links, and the like. In certain embodiments, the transmission system 130 may include a circuit trace, backplane transmission line, optical fiber/wire or the like. It is appreciated by embodiments of the present invention, the coding technology disclosed herein may be implemented within any network architecture suitable for embodiments of the present invention.

The network elements and/or communication links may include circuit-switched as well as packet-data elements to provide transport of content, triggers and/or other information; and may be configured to communicate such information using any number of protocols and in any manner consistent with exchanging such information among transmitter 110 and receiver 120. These protocols may include standardized, proprietary, open-source, and freely-available communication protocols for communicating content in circuit-switching and/or packet data networks, and the like.

The transmitter 110 and receiver 120 may respectively comprise any communication device suitable for embodiments of the present invention. In one embodiment, at least one of the transmitter 110 or receiver 120 comprises at least a general purpose computer system, or components thereof, for example, as shown in FIG. 2.

Figure 2:
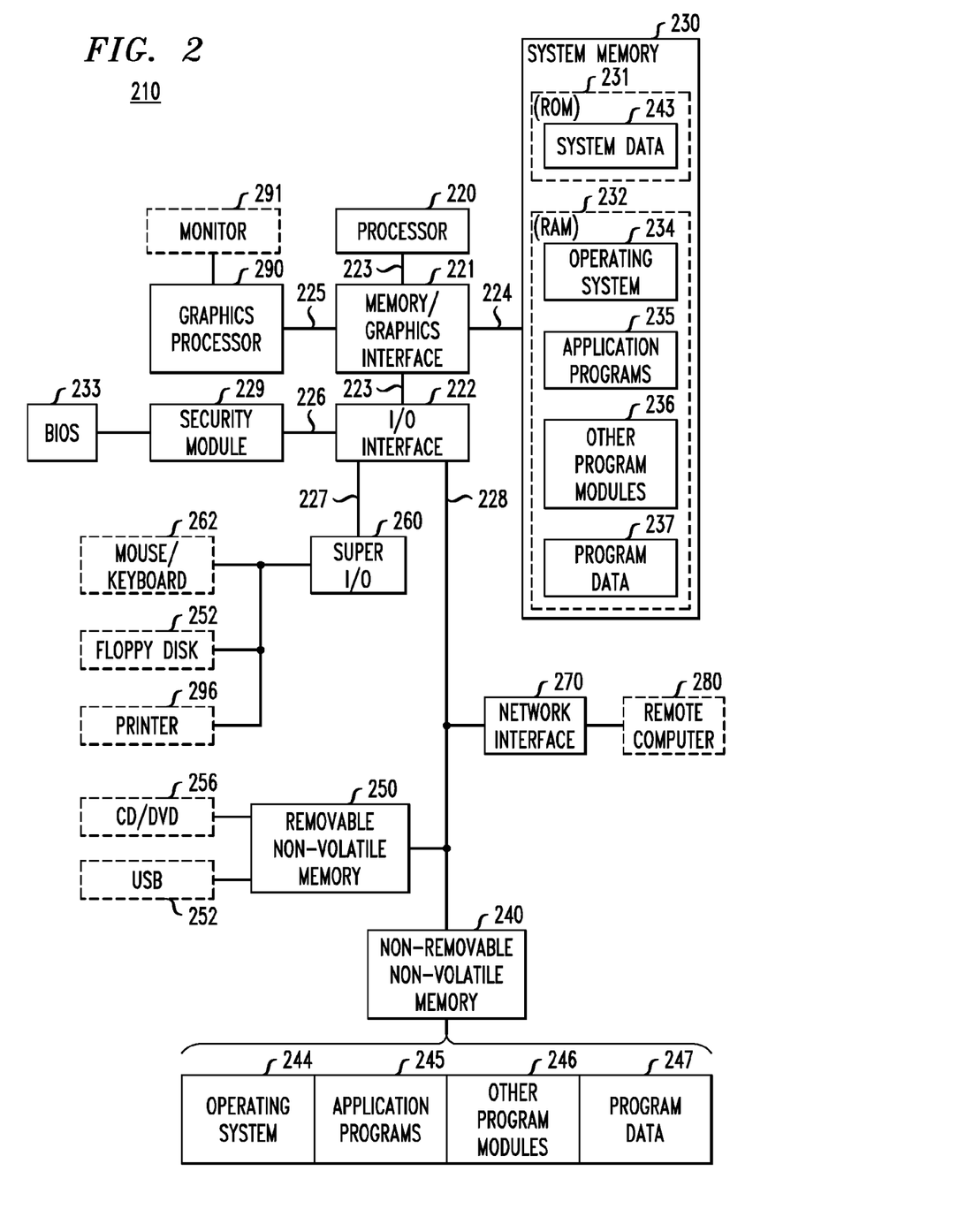
FIG. 2 depicts a general purpose computer system in accordance with one embodiment of the present invention.

With reference to FIG. 2, a general purpose computing system in the form of a computer 210 is shown. As understood by embodiments of the present invention, components shown in dashed outline are not technically part of the computer 210, but are used to illustrate the exemplary embodiment of FIG. 2. Components of computer 210 may include, but are not limited to, a processor 220, a system memory 230, a memory/graphics interface 221, also known as a Northbridge chip, and an I/O interface 222, also known as a Southbridge chip. The system memory 230 and a graphics processor 290 may be coupled to the memory/graphics interface 221. A monitor 291 or other graphic output device may be coupled to the graphics processor 290.

A series of system busses may couple various system components including a high speed system bus 223 between the processor 220, the memory/graphics interface 221 and the I/O interface 222, a front-side bus 224 between the memory/graphics interface 221 and the system memory 230, and an advanced graphics processing (AGP) bus 225 between the memory/graphics interface 221 and the graphics processor 290. The system bus 223 may be any of several types of bus structures including, by way of example, and not limitation, such architectures include Industry Standard Architecture (ISA) bus, Micro Channel Architecture (MCA) bus and Enhanced ISA (EISA) bus. As system architectures evolve, other bus architectures and chip sets may be used but often generally follow this pattern. For example, companies such as Intel and AMD support the Intel Hub Architecture (IHA) and the Hypertransport architecture, respectively.

The computer 210 typically includes a variety of computer readable media. Computer readable media can be any available media that can be accessed by computer 210 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and can accessed by the computer 210. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 230 includes computer storage media in the form of volatile and/or nonvolatile memory such as read only memory (ROM) 231 and random access memory (RAM) 232. The system ROM 231 may contain permanent system data 243, such as identifying and manufacturing information. In some embodiments, a basic input/output system (BIOS) may also be stored in system ROM 231. RAM 232 typically contains data and/or program modules that are immediately accessible to and/or presently being operated on by processor 220. By way of example, and not limitation, FIG. 2 illustrates operating system 234, application programs 235, other program modules 236, and program data 237.

The I/O interface 222 may couple the system bus 223 with a number of other buses 226, 227 and 228 that couple a variety of internal and external devices to the computer 210. A serial peripheral interface (SPI) bus 226 may connect to a BIOS memory 233 containing the basic routines that help to transfer information between elements within computer 210, such as during start-up.

In some embodiments, a security module 229 may be incorporated to manage metering, billing, and enforcement of policies.

A super input/output chip 260 may be used to connect to a number of 'legacy' peripherals, such as floppy disk 252, keyboard/mouse 262, and printer 296, as examples. The super I/O chip 260 may be connected to the I/O interface 222 with a low pin count (LPC) bus, in some embodiments. The super I/O chip 260 is widely available in the commercial marketplace.

In one embodiment, bus 228 may be a Peripheral Component Interconnect (PCI) bus, or a variation thereof, may be used to connect higher speed peripherals to the I/O interface 222. A PCI bus may also be known as a Mezzanine bus. Variations of the PCI bus include the Peripheral Component Interconnect-Express (PCI-E) and the Peripheral Component Interconnect-Extended (PCI-X) busses, the former having a serial interface and the latter being a backward compatible parallel interface. In other embodiments, bus 228 may be an advanced technology attachment (ATA) bus, in the form of a serial ATA bus (SATA) or parallel ATA (PATA).

The computer 210 may also include other removable/non-removable, volatile/nonvolatile computer storage media. By way of example only, FIG. 2 illustrates a hard disk drive 240 that reads from or writes to non-removable, nonvolatile magnetic media. Removable media, such as a universal serial bus (USB) memory 252 or CD/DVD drive 256 may be connected to the PCI bus 228 directly or through an interface 250. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The drives and their associated computer storage media, discussed above and illustrated in FIG. 2, provide storage of computer readable instructions, data structures, program modules and other data for the computer 210. In FIG. 2, for example, hard disk drive 240 is illustrated as storing operating system 244, application programs 245, other program modules 246, and program data 247. Note that these components can either be the same as or different from operating system 234, application programs 235, other program modules 236, and program data 237. Operating system 244, application programs 245, other program modules 246, and program data 247 are given different numbers here to illustrate that, at a minimum, they are different elements within the computer 210. A user may enter commands and information into the computer 210 through input devices such as a mouse/keyboard 262 or other input device combination. Other input devices (not shown) may include a microphone, joystick, game pad, satellite dish, scanner, or the like. These and other input devices are often connected to the processor 220 through one of the I/O interface busses, such as the SPI 226, the LPC 227, or the PCI 228, but other busses may be used. In some embodiments, other devices may be coupled to parallel ports, infrared interfaces, game ports, and the like (not depicted), via the super I/O chip 260.

The computer 210 may operate in a networked environment using logical connections to one or more remote computers, such as a remote computer 280 via a network interface controller (NIC) 270. The remote computer 280 may be a personal computer, a server, a router, a network PC, a peer device or other common network node, and typically includes many or all of the elements described above relative to the computer 210. The logical connection between the NIC 270 and the remote computer 280 depicted in FIG. 2 may include a local area network (LAN), an Ethernet-based network, a wide area network (WAN), or both, but may also include other networks. Such networking environments are commonplace in offices, enterprise-wide computer networks, intranets, and the Internet.

It is appreciated by embodiments of the present invention, in FIG. 1, that both transmitter 110 and receiver 120, may utilize certain of the features of the general computer 210 of FIG. 2, whereas many of such features or elements are incorporated in most communication devices presently in existence. Although not all components of the general computer 210 would necessarily be utilized in a transmitter 110 or receiver 120, one of ordinary skill in the art would appreciate the necessary components disclosed herein required to perform the requisite function of embodiments of the present invention.

The system 100 of FIG. 1 may be utilized to implement the methods and transmission codes discussed herein. It should be noted, however, any transmission system, capable of transmitting bytes of data from a first device to a second device, over any physical medium, may be utilized in accordance with embodiments of the present invention. For ease of reference, where appropriate, reference shall be made to the elements of FIGS. 1 and 2 when describing the transmission codes and methods thereof, below.

A block code is defined as a correspondence between a set of codewords and a set of Messages, each having a fixed length, or block size. In the field of communications, the Messages usually represent a collection of data objects that are intended to be communicated from a source to a destination. The codewords are the actual contents of the transmission from transmitter 110 to receiver 120. Generally, each codeword is associated with only one Message, so that at the receiver 120, the originating Message can be inferred from the codeword that is received. Generally, codewords are implemented to be robust to important transmission impairments, such as noise or limited frequency response encountered within the transmission channel.

An encoder, at the transmitter 110, generally associates the source Message with the codeword to be transmitted. The decoder, at the receiver 120, determines the original Message, based upon the received codeword. Sometimes, due to impairments during transmission, the received word differs from the transmitted codeword.

Under certain circumstances, in accordance with embodiments of the present invention, it is possible to perform a process of error correction, and to infer the transmitted codeword from the received word, in spite of the errors that occur during transmission. Codes that enable this process are referred to as Forward Error Correction (FEC) codes.

Transmission systems that have attenuated transmission at low frequencies motivate a second type of code. These codes produce transmissions that have limited low frequency content. In accordance with an embodiment of the present invention, one method to achieve this, used by Run Length Limited (RLL) codes, is to limit the number of repetitions of the same output. Another method, used in Bounded-Disparity (BD) codes, is to ensure that, on average, each output character is used with roughly the same likelihood.

In accordance with embodiments of the present invention, Modulation—Forward Error Correction (MFEC) codes may be created, simultaneously possessing the characteristics of FEC codes, together with one or more of the Modulation codes, either Bounded-Disparity, or Run-Length-Limited, or both.

In transmission theory, for a binary code, the disparity is defined as the difference in the number of logical "1"s and logical "0"s. The run-length is defined as the maximum number of consecutive "1"s or "0"s. The Hamming distance between any two words is the number of character locations at which they differ. For binary codes, the transmitted characters are bits, and the Hamming distance characterizes the number of bits at which the two words differ.

The dimension of a binary block code is defined as the number of bits in each Message. The Length of a binary block code is defined as the number of bits in each codeword. The minimum distance of a code is defined as the lowest value of the Hamming distance for any two codewords in the code. As appreciated by embodiments of the present invention, the dimension, length and minimum distance are not mutually independent. The length must be at least equal to the dimension. In addition, the minimum distance has lower bounds that depend on both dimension and length. In general, the larger minimum distance corresponds to larger differences between length and dimension.

The maximum number of identical symbols in an RLL code is the run-length limit of the code. For a binary RLL code, the low frequency properties of the encoded transmission are influenced by the run-length limit, because strings of identical bits create low frequency components in the transmission spectrum. By reducing the run-length limit of the code, the amplitude of the low-frequency components in the transmission spectrum is reduced. This is advantageous for signals that will travel through channels having limited low-frequency response, as it results in reduced distortion under such circumstances.

In accordance with embodiments of the present invention, introducing a limitation on the maximum disparity of the code also serves to condition the low frequency spectral properties to advantageous effects. For example, if a binary code were to impose a run-length limit, but allow the relative number of each transmitted bit to be unbalanced, the result would be a low frequency component in the transmission spectrum. By limiting the disparity, within any string of transmitted symbols, the low frequency components are attenuated. The lower the disparity bound, the more attenuated the low frequency components in the transmission spectrum.

Codes that impose run-length limits and/or disparity bounds provide significant opportunities to impact the transmission spectrum, maximizing the ability to match the characteristics of the transmission to the properties and impairments of the communications channel. Creating an MFEC code that possesses both bounded-disparity and run-length-limit demonstrates the ability to create an MFEC code having bounded-disparity or run-length-limiting properties, individually. For the purposes of demonstrating these embodiments, this discussion will focus on creating an MFEC code having all three properties.

Codes that have a minimum distance of two (2), offer the possibility of single error detection. For example, if a transmitted codeword is received with a single error, the resulting received word cannot be a codeword. The received word is separated from the transmitted Codeword by a Hamming distance of 1. However, because the code has minimum distance greater than 1, the received word cannot be a Codeword. Because it is known that only Codewords are transmitted, and because the received word is not a Codeword, it is clear there was some error in transmission. Thus, because the code has minimum distance greater than 1, single errors can be detected.

Codes that have a minimum distance of three (3) offer the possibility of single error correction. For example, a received word that contains a single error will be a Hamming distance of 1 from the transmitted Codeword but at least a Hamming distance of 2 from all other Codewords. Thus, selecting the Codeword nearest in Hamming distance to the received word will correct single errors.

Similarly, codes with minimum distance 2t+1, where t is an integer, will allow for correction of t errors. Codes with minimum distance 2(t+1), for t an integer, will allow for correction of t errors, and detection of t+1 errors.

The properties of the FEC codes are designated (n,k,d), where n is the length of the code, k its dimension, and d its minimum distance.

In accordance with various embodiments, codes that provide forward error correction, as well as codes that provide bounded disparity and/or run-length limitations, are theoretically combined into codes that combine each of these properties, and specific methods for constructing the same.

Further in accordance with embodiments of the present invention, codes are described by a set of five parameters, (n, k, B, R, d), where n, k and d are as defined for FEC codes, B is the disparity bound (the difference between the greatest and least disparity found in any coded transmission), and R is the run-length limit. The codes resulting from embodiments of the present invention can be maximally efficient, in that no code having the same dimension and length could possess greater minimum distance, and lower run-length limit and disparity bound.

Figure 3:
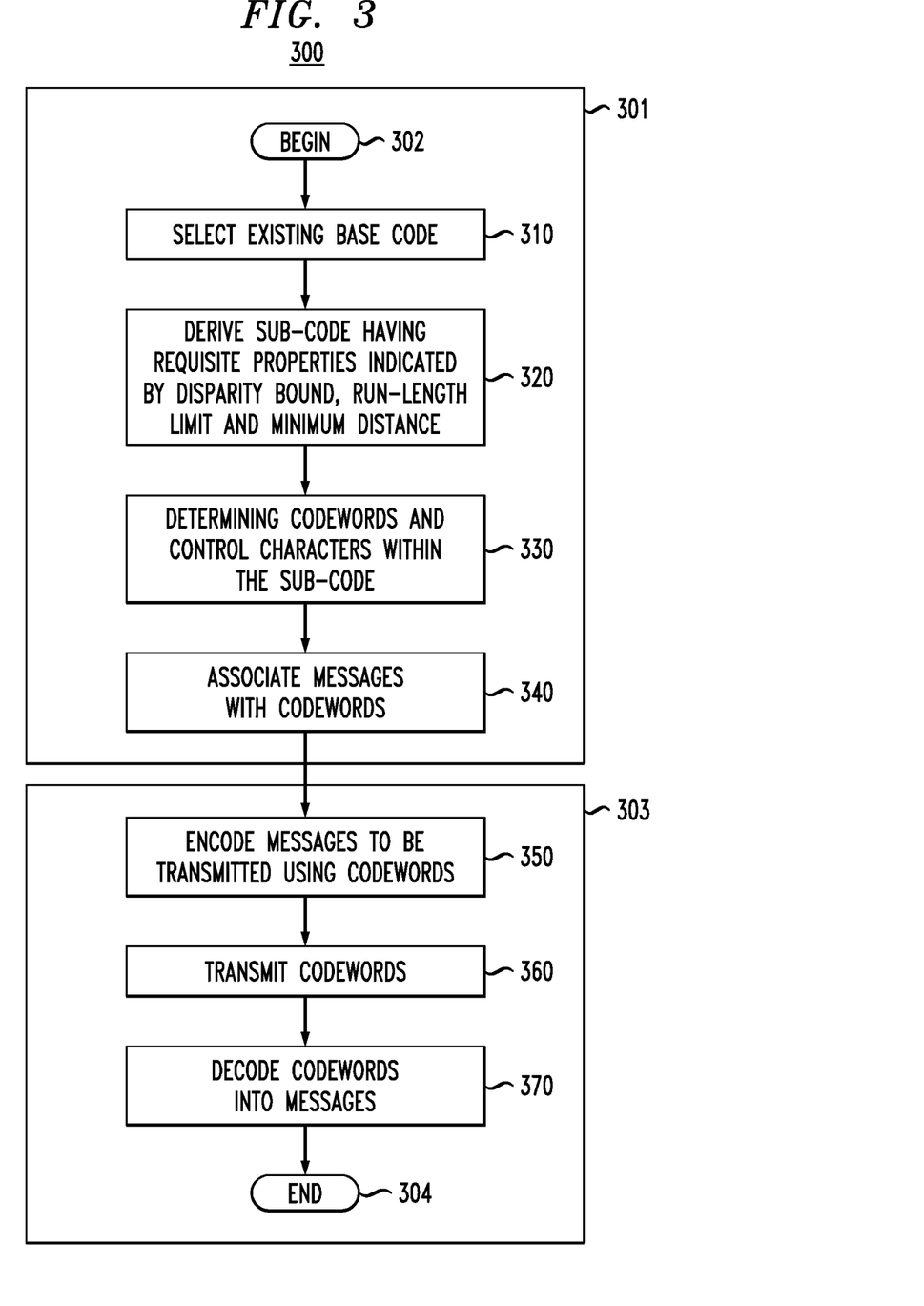
FIG. 3 depicts a flowchart of an exemplary method in accordance with one embodiment of the present invention.

FIG. 3 depicts a flowchart of a broad exemplary method in accordance with one embodiment of the present invention. The method 300 may be considered in two sets of steps. A first set of steps occurs during a development of the MFEC code 301, and a second set of steps occurs during the utilization of the MFEC code 303. Collectively, however, such sets of steps 301 and 303 are representative of a method in accordance with embodiments of the present invention.

The method 300 begins at step 302. At step 310, a base code is selected, and at step 320 a sub-code is derived from the base code, having requisite properties indicated by disparity bound, run-length limit and/or minimum distance, as discussed below.

The construction of MFEC codes may proceed in several ways. In one embodiment, a sub-code is derived from an existing FEC code, whereby the sub-code has a bounded disparity and/or a run-length limitation. This requires, to identify from the FEC code, a subset of codewords having the property that within the subset, there is a disparity bound and/or a run-length limit.

In another embodiment, a reverse strategy may be implemented. In such an embodiment, given an existing RLL or BD code, a sub-code having minimum distance larger than one can be derived.

In yet other embodiments, a strategy may begin with existing codes of any type and deriving a sub-code with the other necessary properties. All of these approaches have the effect of identifying a code having the requisite properties indicated by the disparity bound, run-length limit and minimum distance.

For exemplary purposes, the following disclosure will describe an embodiment of the present invention in detail, wherein an existing FEC code is used as a starting point, and a sub-code is selected from it, having the properties of Bounded Disparity and Run-length Limit In doing so, as shown below, a binary MFEC code is created, with Dimension 8 and length 14, Disparity Bound of 14, Run-length limit of 6 and Minimum Distance of 4. The resulting code is capable of correcting any single bit-error and detecting any double bit-error, in accordance with embodiments of the present invention. The following demonstrated exemplary construction method is capable of producing a broad family of such codes.

At step 330, codewords and control characters are determined from within the sub-code.

In accordance with embodiments of the present invention, the construction method used for deriving MFEC codes often yields codes that have more codewords than needed to satisfy the Dimension of the set of Messages. For example, in the case of the exemplary MFEC code, only 326 of its 348 codewords are required to transmit all 256 Messages. The other codewords are available to be used as special control characters within the code. For instance, they can be used to establish synchronization and identify boundaries between codewords.

In one embodiment, the comma is used as a special type of control character, with the defined property that its sequence of bits is not found within any bit sequence formed by the concatenation of any pair of codewords. Because of this property, commas are readily identifiable in a stream of transmitted symbols, and may be used to indicate the alignment of codewords within the transmission.

The exemplary MFEC code described in the example possesses 14 comma control characters, each of which may be used for establishing word boundaries during synchronization. Beyond simply identifying word boundaries, the control characters can be used to transmit information that is not meant to be Message information. For example, the use of such control characters may be used between the transmitter 110 and receiver 120 of the communication link to exchange status and control information during the initiation and administration of the link.

In accordance with embodiments of the present invention, the minimum distance of the resulting exemplary MFEC code will be no less than that of the FEC base code from which it is derived. For this reason, the error correction and detection properties of the resulting MFEC code will be determined by those of the FEC base code. In the current example, the utilized FEC base code consists of a cyclic Hamming code of length 15 and dimension 10, having minimum distance 4.

Cyclic FEC codes generally have the property that a cyclic permutation of any codeword is also a codeword. The concatenation of any pair of repetitions of a single codeword therefore may contain many other codewords within the transmission, distinguished only by their position relative to the codeword boundaries.

For codes that anticipate the need for comma characters, this cyclic FEC code property would be problematic, in that comma characters must never found within any concatenated transmission, except at the codeword boundaries. In one embodiment, this issue is addressed by permuting the order bits within the codewords, and converting a cyclic Hamming code into an acyclic Hamming code. By doing so, cyclic permutations of the codewords are prevented from being codewords themselves, thereby increasing the likelihood of identifying comma characters.

The (15, 10, 4) Hamming Code of the present example may further be processed to lower its length to 14, and dimension to 9. In accordance with embodiments of the present invention, this may be done by considering the bit at a specific location within the codeword, selecting only those codewords that have a specific value of that bit, and removing that bit from the codeword. By removing the bit from the codeword, the length of the codeword is reduced by one bit. By selecting only those codewords that have a specific value for that bit, the number of codewords is reduced by half, lowering the dimension by one bit, and reducing the size of the Message set by half.

In view of the above processes, the resulting Base FEC code is a (14,9,4) truncated non-cyclic Hamming code, having 512 codewords.

The exemplary Base FEC code requires additional modification, in order to achieve the required disparity characteristics. This is achieved by adding a fixed disparity offset word to each Base FEC codeword. Because the same disparity offset is added to each Base FEC codeword, the relative distance properties of the FEC code are maintained, and the exemplary code retains minimum distance 4. The codewords of the exemplary MFEC are chosen from the resultant acyclically-permuted disparity-offset cyclic Hamming code.

At step 340, Messages are associated with codewords.

The process of encoding a Message for transmission involves associating a codeword with each Message. If the associated codeword has nonzero disparity, then a repeated encoding of the Message will result in a repeated transmission of the nonzero disparity codeword, thus allowing the disparity of the communication to grow without bound.

In order to avoid this outcome, and establish a disparity bound for the transmission, in accordance with the present exemplary embodiment, Messages and codewords may be associated with each other in the following fashion.

In the exemplary embodiment, each codeword having zero disparity is associated with a unique Message. Nonzero-disparity codewords are grouped into pairs having equal and opposite disparity, with the resulting pair being associated with a Message. The disparity of the transmission is monitored, and a choice made of which of the opposite-disparity codewords to transmit, to minimize the magnitude of the disparity of the transmission. Control characters are treated in the same manner as codewords.

For instance, if the disparity of the transmission is positive at the time a Message is encoded for transmission, and if the Message is associated with a pair of nonzero-disparity codewords, the codeword having negative disparity is encoded for transmission, resulting in the Disparity of the transmission being bounded.

In the exemplary MFEC code, there are 186 codewords with zero disparity. Additionally, there are 70 codeword pairs having disparity +/−4. All of the control characters are commas, with 7 having zero-disparity and 7 pairs having disparity +/−4.

As shown in Table 1 below, these are tabulated in the following, organized as (Message, zero-disparity codeword), (Message, disparity −4 codeword, disparity +4 codeword), (Message, zero-disparity comma) and (Message, disparity −4 comma, disparity +4 comma), where the codewords are printed as decimal values of their respective 14-bit binary words.

TABLE 1

Zero-Disparity codewords for (14, 8, 14, 6, 4) exemplary MFEC

{(0, 10917), (1, 10573), (2, 10586), (3, 5421), (4, 9578), (5, 9389), (6, 11557), (7, 11570), (8, 5526), (9, 6566), (10, 4781), (11, 6745), (12, 4970), (13, 5737), (14, 5842), (15, 9877), (16, 10930), (17, 6949), (18, 6962), (19, 11353), (20, 5434), (21, 11657), (22, 6362), (23, 6349), (24, 9402), (25, 5354), (26, 7346), (27, 6577), (28, 7333), (29, 4794), (30, 6734), (31, 9005), (32, 5829), (33, 10066), (34, 11106), (35, 6508), (36, 11342), (37, 6429), (38, 3433), (39, 10539),

TABLE 1-continued

Zero-Disparity codewords for (14, 8, 14, 6, 4) exemplary MFEC (40, 5451), (41, 2477), (42, 10397), (43, 5275), (44, 9419), (45, 11604), (46, 7522), (47, 9681)
(48, 9670), (49, 13478), (50, 11490), (51, 11411), (52, 7049), (53, 4811), (54, 8938), (55, 12877),
(56, 9774), (57, 9785), (58, 9018), (59, 12890), (60, 5812), (61, 9110), (62, 6803), (63, 6882),
(64, 10964), (65, 13094), (66, 10053), (67, 5909), (68, 6996), (69, 5468), (70, 9499), (71, 6315),
(72, 2490), (73, 3257), (74, 3246), (75, 8633), (76, 4585), (77, 9436), (78, 8672), (79, 6262),
(80, 13489), (81, 12722), (82, 12709), (83, 3538), (84, 7380), (85,7818), (86, 2793), (87, 13961),
(88, 8859), (89, 4828), (90, 2862), (91, 2873), (92, 9035), (93, 4891), (94, 5795), (95, 5073),
(96, 5062), (97, 9956), (98, 3734), (99, 2965), (100, 13861), (101, 5988), (102, 10036),
(103, 13105), (104, 13874), (105, 7718), (106, 11027), (107, 7729), (108, 11873), (109, 10556),
(110, 10476), (111, 13665), (112, 11587), (113, 7443), (114, 10721), (115, 3525), (116, 3508),
(117, 13194), (118, 10782), (119, 3629), (120, 3642), (121, 12042), (122, 9052), (123, 10947),
(124, 13908), (125, 10019), (126, 6979), (127, 12574), (128, 13420), (129, 2507), (130, 6332),
(131, 2524), (132, 8563), (133, 3491), (134, 7363), (135, 1753), (136, 3676), (137, 3659),
(138, 12843), (139, 13025), (140, 4711), (141, 3910), (142, 3921), (143, 7592), (144, 1437),
(145, 12405), (146, 9319), (147, 14662), (148, 14673), (149, 3187), (150, 4339), (151, 12756),
(152, 14486), (153, 11176), (154, 1742), (155, 8759), (156, 1653), (157, 13891), (158, 2173),
(159, 7288), (160, 5175), (161, 2407), (162, 10327), (163, 1270), (164, 10631), (165, 10136),
(166, 10872), (167, 1822), (168, 12860), (169, 3044), (170, 14869), (171, 14948), (172, 14381),
(173, 14394), (174, 14732), (175, 2231), (176, 6088), (177, 14212), (178, 14428), (179, 14411),
(180, 12664), (181, 12935), (182, 1367), (183, 13575), (184, 15048), (185, 2004)}

(Message, Zero Disparity Codeword)

TABLE 2

Disparity −4 and Disparity +4 codewords for (14, 8, 14, 6, 4) exemplary MFEC

{(186, 10378, 7541), (187, 4421, 11994), (188, 4434, 11125), (189, 5201, 7641),
(190, 8785, 7630), (191, 8469, 11981), (192, 5190, 6062), (193, 4245, 6901), (194, 8774, 11894),
(195, 2642, 11678), (196, 6410, 13786), (197, 6241, 13686), (198, 10761, 11509),
(199, 4630, 11225), (200, 2629, 11947), (201, 5260, 7070), (202, 4404, 7837),
(203, 9238, 11214), (204, 4387, 6073), (205, 10278, 8026), (206, 2326, 9597),
(207, 10289, 13739), (208, 8389, 13773), (209, 2257, 13213), (210, 2246, 12061),
(211, 8844, 8013), (212, 9858, 14158), (213, 2154, 4989), (214, 12553, 14169),
(215, 8548, 12198), (216, 11396, 6003), (217, 4876, 6523), (218, 6788, 11964),
(219, 7177, 7916), (220, 1101, 15022), (221, 1114, 13982), (422, 4504, 12140),
(223, 1418, 5758), (224, 1318, 9971), (225, 1329, 13046), (226, 12386, 12209),
(227, 3172, 9655), (228, 3093, 6615), (229, 8355, 15033), (230, 8372, 8957), (231, 4324, 15209),
(232, 6696, 5047), (233, 9800, 3454), (234, 1634, 10491), (235, 5890, 13756), (236, 2612, 5607),
(237, 2595, 14227), (238, 11304, 15314), (239, 7428, 7767), (240, 5656, 13435),
(241, 2946, 14747), (242, 3352, 13527), (243, 3272, 13292), (244, 8648, 14306),
(245, 1249, 15284), (246, 2712, 15301), (247, 2888, 3815), (248, 1801, 13143),
(249, 2075, 15267), (250, 1067, 3895), (251, 12456, 11768), (252, 1555, 14647),
(253, 1704, 14072), (254, 1084, 8071), (255, 1159, 1531)}

(Message, Disparity −4 Codeword, Disparity +4 Codeword)

TABLE 3

Zero-Disparity Commas for (14, 8, 14, 6, 4) exemplary MFEC

{(256, 7198), (257, 13341), (258, 12739), (259, 8318), (260, 3980), (261, 1516), (262, 1987)}

(Message, Zero Disparity Comma)

TABLE 4

Disparity −4 and Disparity +4 Commas for (14, 8, 14, 6, 4) exemplary MFEC

{(263, 8402, 10742), (264, 9484, 5373), (265, 8297, 7996), (266, 4142, 7979), (267, 4153, 3995),
(268, 11012, 3059), (269, 13322, 14567)}

(Message, Disparity −4 Comma, Disparity +4 Comma)

For example, the Message 196 (11000100) is associated with codewords 6241 (01100001100001) and 13786 (11010111011010), which have disparity −4 and +4, respectively.

Encoding is the process of associating a transmitted codeword with each Message to be communicated. Decoding is the converse process of determining from the received transmission, which may contain bit-errors, the Message to be communicated. In accordance with embodiments of the present invention, the expansion of the contents of the Message, from its dimension to the length of the codeword, provides the redundant information required to simultaneously allow detection and correction of errors, as well as to condition the spectral properties of the transmission. At step 350, Messages to be transmitted are encoded to produce the transmitted codewords.

Figure 4:
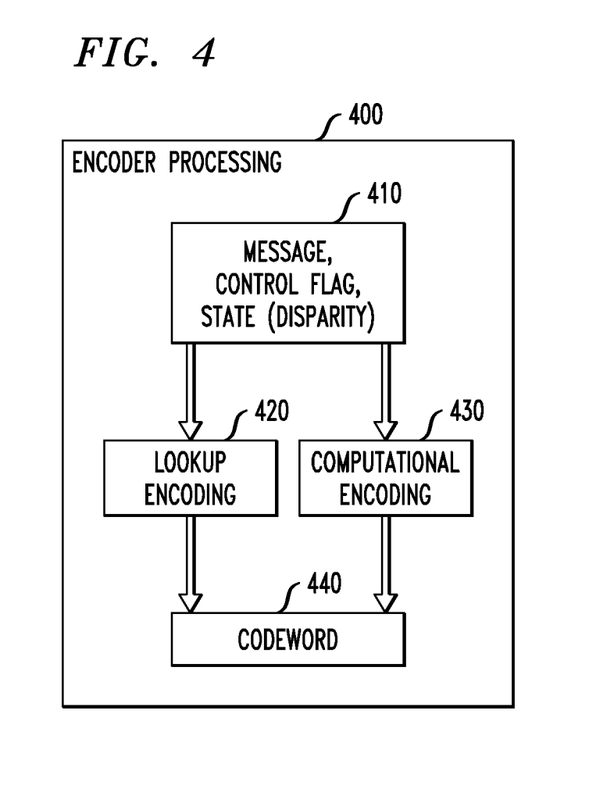
FIG. 4 depicts an Encoding Processor in accordance with one embodiment of the present invention.

FIG. 4 depicts an Encoding Processor in accordance with one embodiment of the present invention. As shown in the Figure, there are two embodiments that may be selected for processing the encoding of the Message. In a first embodiment, following the path down the left side of the Figure, each Message is processed using a Lookup Table 420, which contains the value of the codeword to which the Message is encoded. In such an embodiment, the inputs include the Message, including a control flag indicating whether the Message is a Data Message or a Control Message, such as a comma, as well as the present state indicator.

Figure 5:
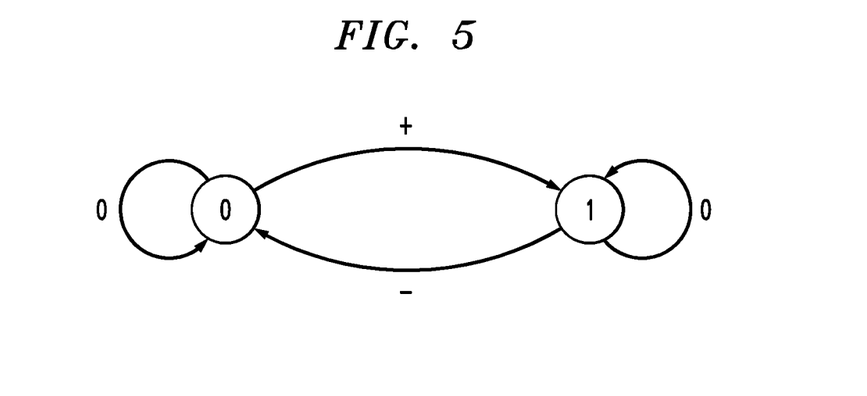
FIG. 5 depicts a simple encoder state machine in accordance with one embodiment of the present invention.

The present state indicator identifies the current disparity state of the transmission, and is updated according to the state machine, for example, as shown in FIG. 5. In a basic embodiment, the codewords are grouped into positive- and negative-disparity pairs. Thus, a decision is made during the Message encoding process, as to which of the pairs will be used as the transmitted codeword.

FIG. 5 depicts an encoder state machine in accordance with one embodiment of the present invention. As shown in the Figure, the state machine could be used to determine which of the pairs is output by the encoder. As each Message is encoded, the state machine transitions from an initial state to a final state, along the paths indicated by the directional arrows. Each state can transition to one of two possible final states, depending upon the disparity of the codeword associated with the communicated Message.

Messages that are associated with zero-disparity codewords induce the transitions denoted by the character "0". These transitions result in the final state being unchanged from the initial state.

Messages associated with nonzero-disparity codewords induce transitions to different final states. The Disparity of the encoded codeword is given by the characters, + or −. These characters indicate which of the pair of positive- and negative-Disparity codewords will be used to encode the communicated Message. On average, the same number of positive Disparity and negative Disparity codewords are transmitted.

In the exemplary MFEC code, presuming the state machine is initially in state 0, the Message sequence {40, 205, 215, 258, 209, 193} would be encoded as {5451, 8026, 8548, 12739, 13213, 4245}, with the state machine transitioning through final states {0, 1, 0, 0, 1, 0}. The Message code 258 represents a comma control character, and is treated in the operation of the state machine exactly as would be a communicated Message. This encoder produces a (14, 8, 14, 6, 4) MFEC code. The disparity in state 0 is −2, while the disparity in state 1 is +2.

Figure 6:
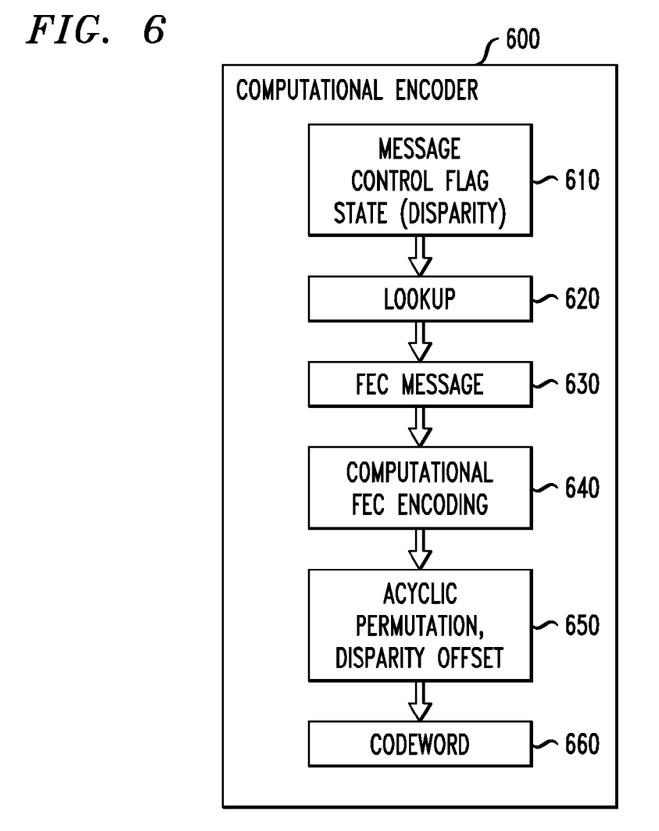
FIG. 6 depicts a Computational Encoding Processor in accordance with one embodiment of the present invention.

Returning to FIG. 4, in the second embodiment for processing the encoding of the Message, following a path down the right side of the Figure, each Message is processed by a computational encoder 430, as detailed in FIG. 6. The Computational Encoder may be advantageous and more efficient for larger codes, for which direct use of lookup encoding may be impractical or undesirable. Computational Encoding makes use of the underlying mathematical structure of the Base FEC Code. In such an embodiment, a first step is to use a Lookup Table 620 to process the Message 610, including a control flag and state identifier, to obtain a base FEC Message 630 that will be processed using methods available for the Base FEC Code, as shown in block 640.

In the exemplary embodiment, discussed supra, the Base FEC code is a cyclic Hamming code. This is a linear code, for which linear algebraic methods permit the computational conversion of a Base FEC Message to be encoded into a Base FEC Codeword. In block 650, this Base FEC Codeword is then acyclically permuted and offset by the modulo-2 addition of disparity-offset word, to yield the transmitted Codeword 660.

Returning to FIG. 3, at step 360, the codewords are transmitted from the transmitter 110 to the receiver 120. At step 370, the codewords are decoded into Messages.

Figure 7:
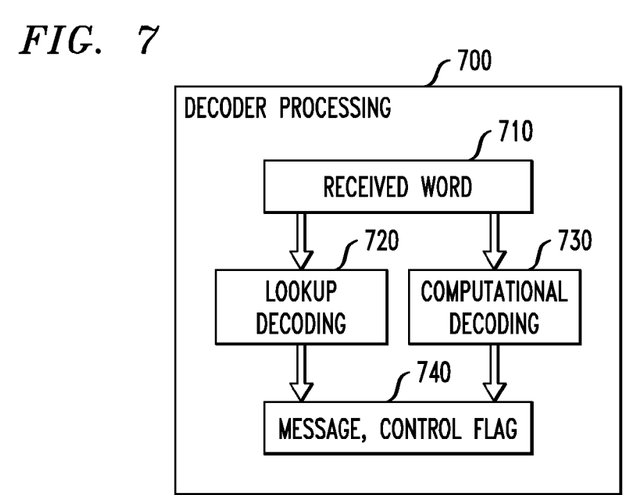
FIG. 7 depicts a Decoding Processor in accordance with one embodiment of the present invention.

As with the encoding process, there are two different methods of decoding the received word, as shown in FIG. 7. In a first method, down the left side of the Figure, the received word 710 is decoded into Message and Control Flag, by direct processing in a Lookup Table, illustrated as block 720.

Figure 8:
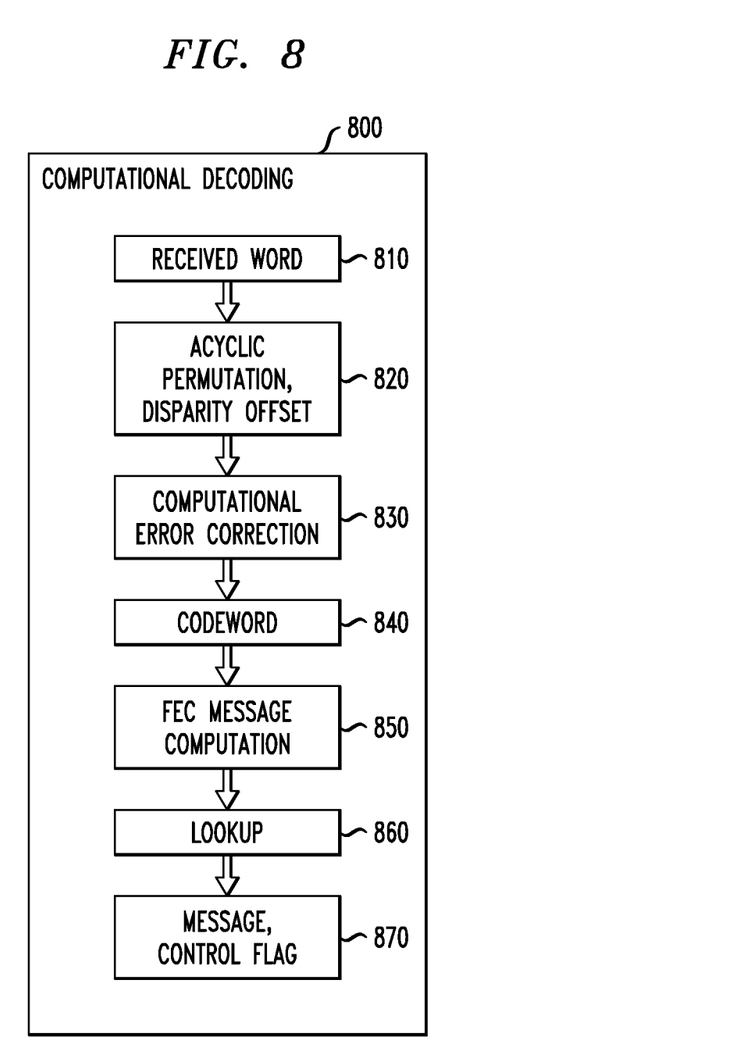
FIG. 8 depicts a Computational Decoding Processor in accordance with one embodiment of the present invention.

In the second method, down the right side of the Figure, the received word 710 is processed computationally, as shown in block 730, using the methods associated with the Base FEC code, to produce a Base FEC Message 740. This Base FEC Message is subsequently processed by Lookup Table, to yield the original Message. FIG. 8 depicts a more detailed method of computational decoding in accordance with one embodiment of the present invention.

In the exemplary embodiment 800, the received word 810 is decoded by first removing the offset and acyclic permutation associated with encoding 820. Next, at block 830, the Hamming code is processed, for example using linear algebraic syndrome decoding, to determine the nearest error-free Codeword 840 of the Base FEC code. As shown in the Figure, this step is followed either by decoding the Base FEC Codeword to the intermediate Base FEC Message 850, or directly to the Message 870 using a Lookup Table 860.

For the exemplary MFEC code, suppose the word 1705 (binary 00011010101001) is received. Using the first decoding method, Lookup Table processing is used to convert the received word 1705 to the original Message 253 (11111101).

In the second decoding method, received word is added modulo-2 to the offset word 2060 (00100000001100), to yield the offset received word 3749 (00111010100101). The Base FEC decoder processes this received word and determines it separated from codeword 3748 (00111010100100) by Hamming distance of 1. Because the FEC base code has minimum distance 4, there is only one codeword that is separated from 3749 by Hamming distance 1, so the decoder declares success.

The corrected Base FEC Codeword, 3748 (00111010100100), may then processed by Lookup Table to determine the original Message 253 (11111101).

Alternatively, the Base FEC Codeword may be further processed using computational linear algebraic methods, to project a Base FEC Message from the Base FEC Codeword. This process uses matrix multiplication to determine the Base FEC Message to be 288 (100100000). This Base FEC Message may be finally processed by Lookup Table to produce the original Message 253 (11111101). Computational processing using matrix multiplication in this way places a lower burden on the final Lookup Table process, because the number of Base FEC Messages is smaller than the number of Base FEC Codewords.

The process of decoding operates on codewords, each having an identical length, determined by the block length of the base code from which it is derived. In the case of a MFEC code derived from a FEC base code, the codeword length is the block length of the underlying FEC code. In the case of low-block-length FEC codes, this length is small, and results in a low-latency decoding process. This low latency is highly advantageous for transmission line codes, as it provides an opportunity to encode and decode the transmission code without significantly limiting the overall rate of transmission.

The method 300 ends at step 304.

While the foregoing is directed to embodiments of the present invention, other and further embodiments of the invention may be devised without departing from the basic scope thereof.

What is claimed is:

1. A method for generating binary block bounded-disparity run-length-limited forward error correction transmission codes comprising:
   selecting an existing base code;
   deriving a sub-code from the existing base code, having properties indicated by disparity bound, run-length limit and minimum distance;
   ascertaining a plurality of codewords and control characters from within the sub-code;
   encoding Messages to be transmitted with at least one codeword from the plurality of codewords;
   transmitting codewords from a transmitter to a receiver; and
   decoding the codewords into Messages.

2. The method of claim 1, wherein the existing base code is a Forward Error Correction Base Code.

3. The method of claim 1, wherein ascertaining a plurality of codewords and control characters comprises identifying comma characters, whereby comma characters possess a sequence of bits not found within any bit sequence formed by the concatenation of any pair of codewords.

4. The method of claim 1, further comprising distinguishing non-zero disparity codewords from zero disparity codewords prior to encoding Messages to be transmitted with at least one codeword.

5. The method of claim 4, further comprising pairing opposing disparity codewords with one another, and associating the paired opposing disparity codewords with a single Message during encoding.

6. The method of claim 1, further comprising utilizing a state machine at the encoder to determine which of a pair of non-zero disparity codewords are associated with a particular Message.

7. The method of claim 6, wherein the state machine comprises one of a two-state machine or a four-state machine.

8. The method of claim 1, wherein decoding the codewords into Messages comprises analyzing a received word, and comparing the received word to a list of codewords.

9. The method of claim 8, further comprising selecting the closest codeword from the list of codewords in view of the received word.

10. A tangible computer readable medium comprising program instructions, wherein the program instructions are computer-executable to implement:
    selecting an existing binary block base code;
    deriving a sub-code from the existing base code, having properties indicated by disparity bound, run-length limit and minimum distance;
    ascertaining a plurality of codewords and control characters from within the sub-code;
    encoding Messages to be transmitted with at least one codeword from the plurality of codewords; and
    transmitting codewords from a transmitter to a receiver.

11. The tangible computer readable medium of claim 10, further comprising decoding the codewords into Messages.

12. The tangible computer readable medium of claim 10, further comprising distinguishing non-zero disparity codewords from zero disparity codewords prior to encoding Messages to be transmitted with at least one codeword.

13. The tangible computer readable medium of claim 12, further comprising pairing opposing disparity codewords with one another, and associating the paired opposing disparity codewords with a single Message during encoding.

14. A system for utilizing bounded-disparity run-length-limited forward error correction transmission codes comprising:
    a transmitter for transmitting Messages;
    a receiver for receiving Messages;
    an encoder located with the transmitter, the encoder comprising a tangible computer readable medium comprising program instructions, wherein the program instructions are computer-executable to implement:
       selecting an existing binary block base code;
       deriving a sub-code from the existing base code, having properties indicated by disparity bound, run-length limit and minimum distance;
       ascertaining a plurality of codewords and control characters from within the sub-code;
       encoding Messages to be transmitted with at least one codeword from the plurality of codewords; and
       transmitting codewords from a transmitter to a receiver; and
    a decoder located with the receiver, the decoder comprising: a tangible computer readable medium comprising program instructions, wherein the program instructions are computer-executable to implement decoding the codewords into Messages.

15. The system of claim 14, wherein the existing base code is a Forward Error Correction Base Code.

16. The system of claim 14, wherein decoding the codewords into Messages further comprises analyzing a received word, and comparing the received word to a list of codewords.

17. The system of claim 14, wherein non-zero disparity codewords are distinguished from zero disparity codewords prior to encoding Messages to be transmitted with at least one codeword.

18. The system of claim 17, wherein opposing disparity codewords are paired with one another, and the paired opposing disparity codewords are associated with a single Message during encoding.

19. The system of claim 14, further comprising a state machine at the encoder to determine which of a pair of non-zero disparity codewords are associated with a particular Message.

20. The system of claim 19, wherein the state machine comprises one of a two-state machine or a four-state machine.

* * * * *